(12) United States Patent
Ohmi et al.

(10) Patent No.: US 9,240,505 B2
(45) Date of Patent: Jan. 19, 2016

(54) METHOD OF ETCHING BACKSIDE SI SUBSTRATE OF SOI SUBSTRATE TO EXPOSE SIO₂ LAYER USING FLUONITRIC ACID

(75) Inventors: Tadahiro Ohmi, Sendai (JP);
Tomotsugu Ohashi, Singapore (SG);
Kazuhiro Yoshikawa, Inashiki-gun (JP);
Tatsuro Yoshida, Sendai-shi (JP);
Teppei Uchimura, Hamamatsu (JP);
Kazuki Soeda, Hamamatsu (JP);
Shigetoshi Sugawa, Sendai (JP)

(73) Assignee: TOHOKU UNIVERSITY, Miyagi (JP)

( * ) Notice: Subject to any disclaimer, the term of this patent is extended or adjusted under 35 U.S.C. 154(b) by 72 days.

(21) Appl. No.: 13/883,828

(22) PCT Filed: Oct. 28, 2011

(86) PCT No.: PCT/JP2011/006034
§ 371 (c)(1),
(2), (4) Date: Aug. 6, 2013

(87) PCT Pub. No.: WO2012/063425
PCT Pub. Date: May 18, 2012

(65) Prior Publication Data
US 2013/0320477 A1    Dec. 5, 2013

(30) Foreign Application Priority Data

Nov. 12, 2010  (JP) .................................. 2010-254114
May 12, 2011   (JP) .................................. 2011-107701

(51) Int. Cl.
*H01L 21/00*       (2006.01)
*H01L 21/20*       (2006.01)
*H01L 31/0248*     (2006.01)
*H01L 21/306*      (2006.01)
*H01L 21/67*       (2006.01)
(Continued)

(52) U.S. Cl.
CPC ....... *H01L 31/0248* (2013.01); *H01L 21/30604* (2013.01); *H01L 21/6708* (2013.01); *H01L 29/78603* (2013.01); *H01L 27/1464* (2013.01)

(58) Field of Classification Search
CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
USPC ................ 438/22–47, 69, 493, 503, 507, 956
See application file for complete search history.

(56) References Cited

U.S. PATENT DOCUMENTS

2002/0037654 A1*  3/2002  Hayashi et al. ................ 438/745
2004/0092104 A1*  5/2004  Gunn et al. .................... 438/689
(Continued)

FOREIGN PATENT DOCUMENTS

JP       05-226203         9/1993
JP       2004-056046       2/2004
(Continued)

OTHER PUBLICATIONS

Yoshikawa, et al., "Silicon Wafer Thinning Technology for Three-Dimensional Integrated Circuit by Wet Etching", IEICE Technical Report (2009) 15-9.

*Primary Examiner* — Robert Bachner
*Assistant Examiner* — Moin Rahman
(74) *Attorney, Agent, or Firm* — Fitzpatrick, Cella, Harper & Scinto

(57) ABSTRACT

A method of etching capable of rapidly and flatly performing wet etching on a Si substrate using fluonitric acid represented by HF(a)HNO₃(b)H₂O(c) (where the unit of a, b and c is wt % and a+b+c=100). The etching rate of an SiO₂ layer with the highly concentrated fluonitric acid is significantly lowered by the appropriate selection of its composition as compared with the etching rate of the Si substrate, and etch the Si substrate until the SiO₂ layer is exposed. In this way, it is possible to rapidly etch the Si substrate and significantly enhance the flatness of the etched surface.

5 Claims, 10 Drawing Sheets

(51) Int. Cl.
*H01L 29/786* (2006.01)
*H01L 27/146* (2006.01)

(56) References Cited

U.S. PATENT DOCUMENTS

| | | | |
|---|---|---|---|
| 2007/0117281 A1* | 5/2007 | Endo et al. | B08B 3/08 438/149 |
| 2009/0127649 A1* | 5/2009 | Uchiyama | 257/506 |
| 2010/0233882 A1* | 9/2010 | Yu | 438/704 |

FOREIGN PATENT DOCUMENTS

| | | |
|---|---|---|
| JP | 2006-066726 | 3/2006 |
| JP | 2007-119300 | 5/2007 |
| JP | 2009-238985 | 10/2009 |
| JP | 2010-093082 | 4/2010 |
| JP | 2010-258463 | 11/2010 |

* cited by examiner

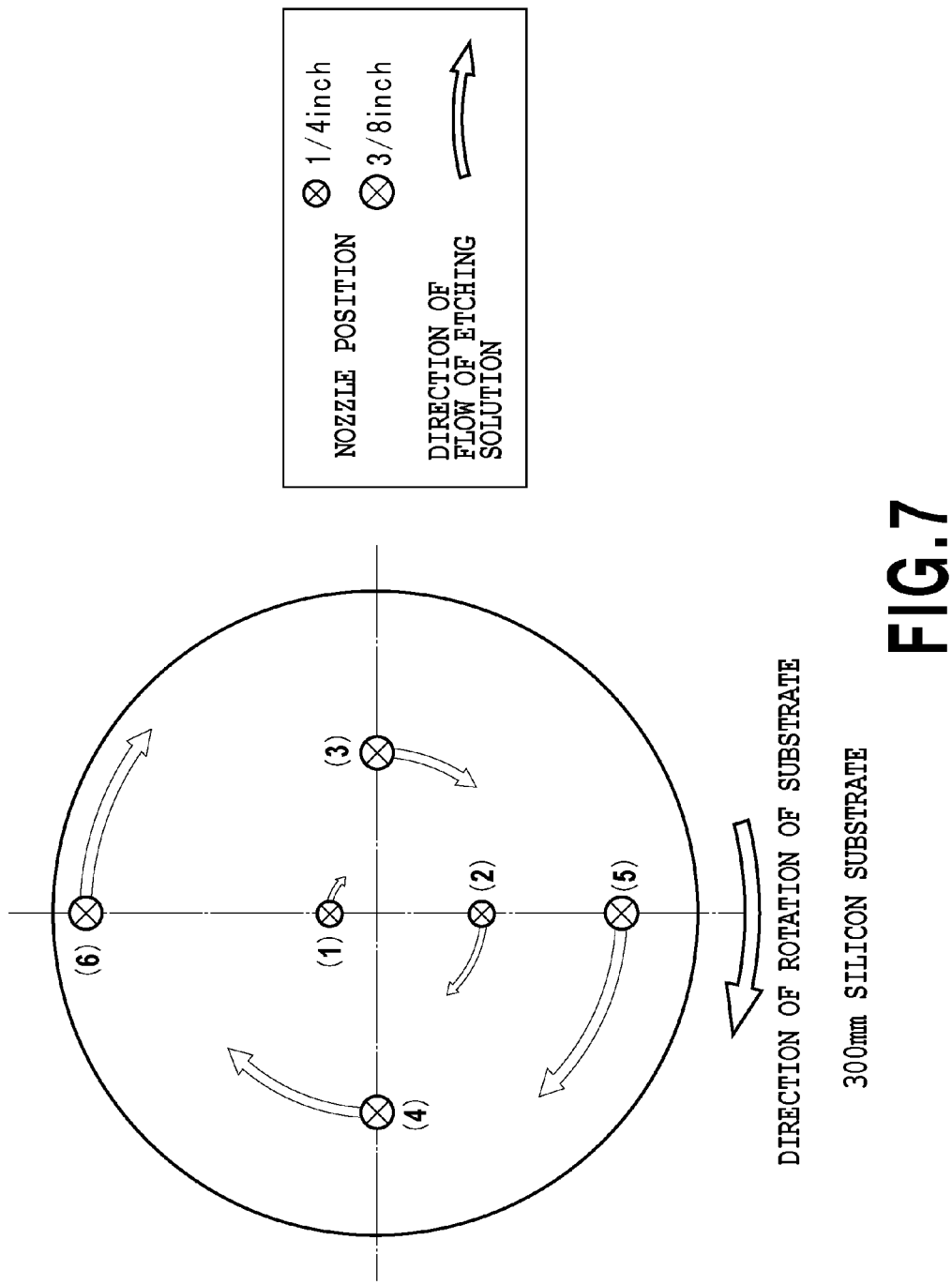

METHOD OF ETCHING BACKSIDE SI SUBSTRATE OF SOI SUBSTRATE TO EXPOSE SIO$_2$ LAYER USING FLUONITRIC ACID

This application is a national phase of PCT application No. PCT/JP2011/006034 filed Oct. 28, 2011, which in turn claims benefit of JP Application Nos. 2010-254114 filed Nov. 12, 2010 and JP 2011-107701 filed May 12, 2011.

TECHNICAL FIELD

The present invention relates to a method of etching an SOI substrate and a backside illumination type photoelectric conversion module on an SOI substrate and a method of producing it.

BACKGROUND ART

A semiconductor device using an SOI (Silicon On Insulator) substrate is advantageous over a semiconductor device using a Si substrate in an operation speed and energy saving, and, even in the field of a photoelectric conversion device such as an image sensor, it is proposed to utilize the SOI substrate. Here, the "SOI substrate" refers to a substrate in which an SiO$_2$ layer is inserted between a Si substrate and a surface Si layer. The "surface Si layer" may contain an impurity.

An image sensor such as a CCD image sensor or a CMOS image sensor is a sensor in which photoelectric conversion elements such as photodiodes are arranged in a matrix, and each photoelectric conversion element functions as a pixel. In recent years, the opportunity of performing shooting and observing an object with high definition and high resolution has been increasing, and a high-density image sensor in which photoelectric conversion elements are arranged in high density has been increasingly proposed and developed.

As the photoelectric conversion elements are more densely arranged, the area of a light receiving surface of each photoelectric conversion element is inevitably reduced. Since as the area of the light receiving surface is reduced, the amount of light per unit time is reduced, it is necessary to increase the light sensitivity of each photoelectric conversion element. However, there is a limitation in it.

Furthermore, a major cause of the area of the light receiving surface becoming smaller beyond necessity as density increases is the area occupied by wiring for feeding signals to the individual photoelectric conversion elements and the drive elements thereof and for applying a predetermined voltage to a predetermined portion of the image sensor. In general, for ease of manufacturing, in order for the resistance of the wiring to be kept low, the width of the wiring is designed to be maximized. Hence, the ratio of the area occupied by the wiring on the surface of the image sensor is increased as the photoelectric conversion elements are more densely arranged. In order to avoid it, it is proposed not to reduce the resistance by increasing the width of the wiring but to reduce the resistance by increasing the thickness of the wiring, and it becomes commercially practical; however, this increases the number of manufacturing steps to cause cost increase.

As an example of a photoelectric conversion module on an SOI substrate, there is a photoelectric conversion module in which a second substrate where a photoelectric conversion portion having a plurality of photoelectric conversion elements on the surface Si layer of the SOI substrate is provided and a drive circuit is provided is adhered to the SOI substrate such that the drive circuit and the photoelectric conversion portion face each other. In recent years, as an idea of achieving both high light sensitivity and high density on the photoelectric conversion module described above, a large number of so-called backside illumination type image sensors in which, from the opposite side of an entrance direction to the photoelectric conversion element of a general image sensor, that is, from the backside of the Si substrate, light is transmitted through an SiO$_2$ layer to enter the photoelectric conversion element are proposed, and part of them become commercially practical.

Although backside illumination is adopted because it is possible to reduce the influence of wiring, since light is made to enter the photoelectric conversion element through the Si substrate, it is necessary to provide an idea that light of any color (wavelength) is made to efficiently enter the light receiving surface of the corresponding photoelectric conversion element. One proposal is to remove the Si substrate from the backside by CMP (Chemical Mechanical Polishing) or wet etching, to reduce the thickness of the Si substrate as much as possible and to suppress the absorption of light by the Si substrate.

Since the Si substrate is relatively thick, it is ground to a predetermined thickness by CMP, and thereafter wet etching is performed to remove a so-called damage layer caused by CMP. Hence, a large amount of time is taken to limit the efficiency of production, and thus it becomes a cause of cost increase.

Non Patent Literature 1 discloses a Si wafer wet etching technology using highly concentrated fluonitric acid. Although fluonitric acid is strongly acid to limit the materials of a container for transportation or storage, a container at the time of use, a pipe and the like, and is currently used with its acid concentration reduced to some degree, among fluonitric acids disclosed in Non Patent Literature 1, there is a fluonitric acid that has a high etching rate of 800 µm/min for a Si wafer. When such a fluonitric acid is used, there is a possibility that the thickness of the backside can be rapidly reduced to a predetermined thickness without mechanical polishing. Then, a backside illumination type image sensor is manufactured by the wet etching technology described above, and thus it is possible to expect significant increase in production efficiency.

CITATION LIST

Non Patent Literature

NPL 1: "Technology for reducing a thickness of a silicon wafer by wet etching for multilayer deposition of a three-dimensional chip" by Yoshikawa et al. IEICE Technical Report 2009

SUMMARY OF INVENTION

Technical Problem

However, when the present inventors used the fluonitric acid disclosed in Non Patent Literature 1 to etch the backside of the Si substrate and reduced the thickness of the backside of the Si substrate in the production of the photoelectric conversion module on the SOI substrate described above, an infinite number of projections and recesses (micro-roughness) were randomly formed on the etched surface. It has been found that the surface described above is a light entrance surface for introducing light to the photoelectric conversion portion in backside illumination, that such projections and recesses cause scattering and diffuse reflection of entrance light and that it is difficult to efficiently take external light in the photoelectric conversion portion. It has also been found that there is a tendency that as the concentrations of hydrofluoric acid and nitric acid are adjusted to increase the etching rate, the size of the projections and recesses is increased and the distribution of the size of the projections and recesses is widened.

The present invention is made in view of the foregoing problem; a first object of the present invention is to provide an etching method which is a method of etching an SOI substrate and which is capable of rapidly and flatly performing wet etching on a Si substrate.

In addition, a second object of the present invention is to provide a backside illumination type photoelectric conversion module which is a backside illumination type photoelectric conversion module on an SOI substrate and which suppresses the absorption of entrance light by a Si substrate and also enhances the flatness of a light entrance surface in backside illumination.

Moreover, a third object of the present invention is to provide a method of producing such a backside illumination type photoelectric conversion module.

Solution to Problem

To achieve the above objects, a first aspect of the present invention is a method of etching an SOI substrate, including, a step of exposing a free surface of a Si substrate in the SOI substrate in which an $SiO_2$ layer is inserted between the Si substrate and a surface Si layer, to a fluonitric acid $HF(a)$ $HNO_3(b)H_2O(c)$ (where a, b and c are numerical values representing concentrations, the unit thereof is wt % and a+b+c=100), until at least a part of the $SiO_2$ layer is exposed, wherein a composition of the fluonitric acid satisfies a+b≥50.

Moreover, according to a second aspect of the present invention, in the first aspect, the $SiO_2$ layer is an $SiO_2$ layer having a stoichiometric composition ratio.

Furthermore, according to a third aspect of the present invention, in the first or second aspect, the composition of the fluonitric acid satisfies 19≤a≤42.

In addition, according to a fourth aspect of the present invention, in the third aspect, the composition of the fluonitric acid further satisfies 23≤a≤40.

Moreover, according to a fifth aspect of the present invention, in the fourth aspect, the composition of the fluonitric acid further satisfies 27≤a≤37.

Furthermore, a sixth aspect of the present invention is a backside illumination type photoelectric conversion module including: an SOI substrate in which an $SiO_2$ layer is inserted between a Si substrate and a surface Si layer; and a photoelectric conversion portion that has a plurality of photoelectric conversion elements provided on the surface Si layer, wherein the Si substrate has an opening portion that exposes the $SiO_2$ layer, and the opening portion is an entrance surface through which light enters the photoelectric conversion portion.

In addition, according to a seventh aspect of the present invention, in the sixth aspect, the $SiO_2$ layer is an $SiO_2$ layer having a stoichiometric composition ratio.

An eighth aspect of the present invention is a method of producing a backside illumination type photoelectric conversion module, the method including the steps of: producing a pre-photoelectric conversion module in which a photoelectric conversion portion having a plurality of photoelectric conversion elements on the surface Si layer of an SOI substrate where an $SiO_2$ layer is inserted between a Si substrate and a surface Si layer is provided; and etching a free surface of the Si substrate of the pre-photoelectric conversion module with the etching method according to anyone of claims 1 to 5, wherein an opening portion that exposes the $SiO_2$ layer is an entrance surface through which light enters the photoelectric conversion portion.

Advantageous Effects of Invention

According to the etching method of the present invention, a step is included of exposing a free surface of a Si substrate in the SOI substrate in which an $SiO_2$ layer is inserted between the Si substrate and a surface Si layer, to a fluonitric acid $HF(a)HNO_3(b)H_2O(c)$ (where a, b and c are numerical values representing concentrations, the unit thereof is wt % and a+b+c=100), until at least a part of the $SiO_2$ layer is exposed, and the composition of the fluonitric acid satisfies a+b≥50, thereby making it possible to rapidly and flatly perform wet etching on the Si substrate.

Furthermore, according to the backside illumination type photoelectric conversion module of the present invention, an SOI substrate in which an $SiO_2$ layer is inserted between a Si substrate and a surface Si layer and a photoelectric conversion portion that has a plurality of photoelectric conversion elements provided on the surface Si layer are included, and the Si substrate has an opening portion that exposes the $SiO_2$ layer, and the opening portion is an entrance surface through which light enters the photoelectric conversion portion, thereby making it possible to provide the backside illumination type photoelectric conversion module which suppresses the absorption of entrance light by the Si substrate and which enhances the flatness of a light entrance surface in backside illumination.

Moreover, according to the method of producing a backside illumination type photoelectric conversion module according to the present invention, a step of producing a pre-photoelectric conversion module in which a photoelectric conversion portion having a plurality of photoelectric conversion elements on the surface Si layer of an SOI substrate where an $SiO_2$ layer is inserted between a Si substrate and a surface Si layer is provided and a step of etching a free surface of the Si substrate of the pre-photoelectric conversion module with the etching method according to the present invention are included, thereby making it possible to significantly enhance the efficiency of the production.

BRIEF DESCRIPTION OF DRAWINGS

FIG. 7 is a schematic diagram for illustrating a relationship between nozzle positions and a rotational direction.

DESCRIPTION OF EMBODIMENTS

An embodiment of the present invention will be described in detail below with reference to accompanying drawings.

(Etching Method According to the Present Invention)

An etching method according to the present invention performs wet etching on the Si substrate of an SOI substrate with highly concentrated fluonitric acid. Fluonitric acid can be generally represented by $HF(a)HNO_3(b)H_2O(c)$ (where a, b and c are values representing concentrations, the unit thereof is wt % and a+b+c=100). The present inventors find that the etching rate of an $SiO_2$ layer with the highly concentrated fluonitric acid is significantly lowered by the appropriate selection of its composition as compared with the etching rate of the Si substrate, and etch the Si substrate until the $SiO_2$ layer is exposed. In this way, it is possible to rapidly etch the Si substrate and significantly enhance the flatness of the etched surface as compared with a conventional method. Even when the composition of the highly concentrated fluonitric acid is adapted to slightly etch the $SiO_2$ layer, since the etching of the Si substrate is rapidly completed, practically, the etching of the $SiO_2$ layer hardly advances and the $SiO_2$ layer having a flat surface is exposed. Here, the "highly concentrated" of the highly concentrated fluonitric acid indicates that, as will be described later, the total a+b of the concentration of hydrofluoric acid and the concentration of nitric acid is 50 wt % or more.

Although no discussion is particularly given to the following description, necessary additives may be added depending on the purpose to the highly concentrated fluonitric acid $HF(a)HNO_3(b)H_2O(c)$ used in the etching method according to the present invention as long as they do not adversely affect the etching rate in practical use. As an example of the additive described above, there is acetic acid. Acetic acid is added so as to enhance wettability of an etching solution and the smoothness of the silicon surface. In the present invention, the amount of acetic acid added is regarded as part of the proportion of water. In the present invention, the amount of acetic acid added is preferably up to about 10 and several wt %, and is more preferably 10 wt % or less.

Figure 1:
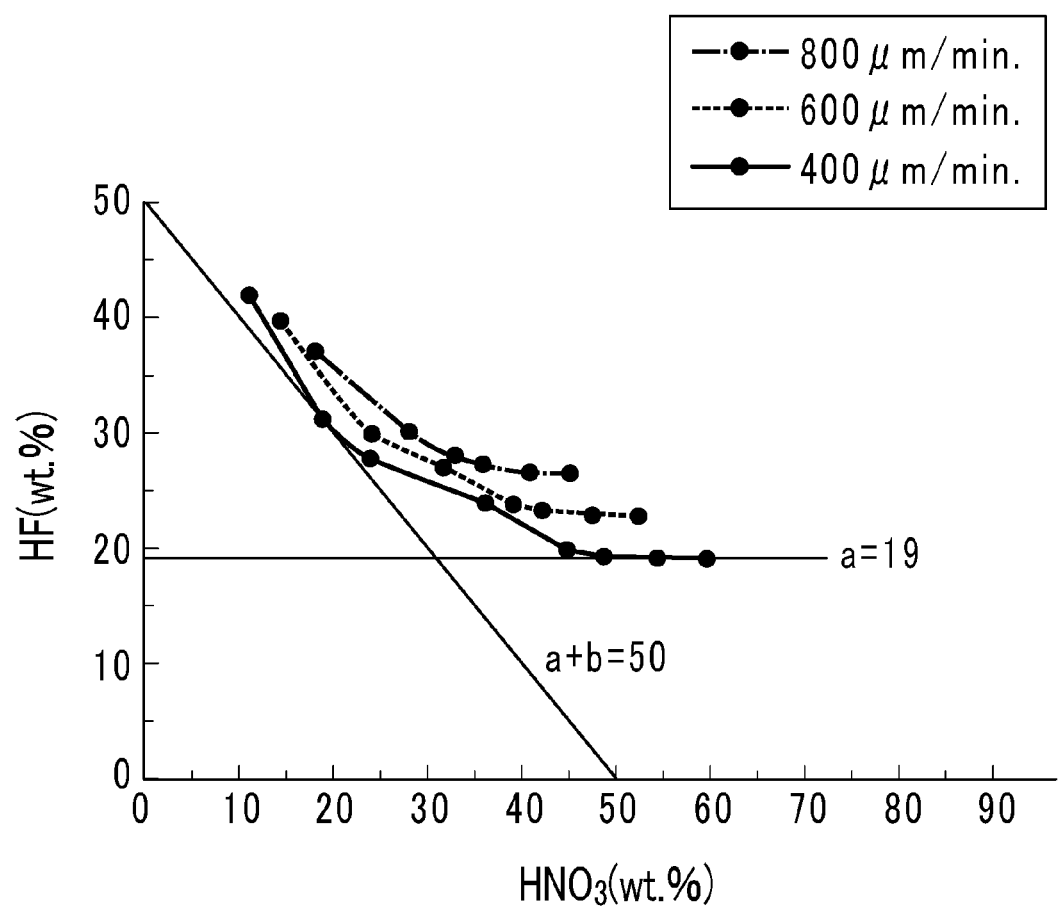
FIG. 1 is a diagram showing the results of an experiment of etching a Si substrate while changing the composition of fluonitric acid.

FIG. 1 shows the results of an experiment (this experiment is hereinafter also referred to as "experiment 1") of etching the Si substrate while changing the composition of fluonitric acid; table 1 shows data on the results of the experiment. Commercially available hydrofluoric acid (50 wt % hydrofluoric acid made by Stellachemifa Corporation) and nitric acid (70 wt % nitric acid of EL grade made by Mitsubishi Chemical Corporation) were prepared, ultrapure water (of 18.25 MΩ or more for the electronic industry) was added as necessary and sample solutions Nos. 1 to 21 of fluonitric acid in which the concentrations of the hydrofluoric acid and the nitric acid were values shown in table 1 were prepared. Samples Nos. 1 to 21 of a Si wafer chip (10 mm×30 mm, 725 μm thick P-type Si wafer chip) were prepared, sample solutions Nos. 1 to 21 were used for these samples Nos. 1 to 21 and the etching rate of fluonitric acid of each acid concentration was determined. The chip sample was shaken within the sample solution at a speed of 1.5 seconds/round trip in a range of 3 cm to 5 cm in the direction of the flat surface of the chip sample. The etching rate was assumed to be the amount of etching on one side per minute. The thickness before and after the etching was measured with a wafer laser thickness measuring device (PLT-1315 made by Possible Inc.)

TABLE 1

| Sample solution No. | Etching rate (μm/min) | HF (wt %) | $HNO_3$ (wt %) |
|---|---|---|---|
| 1 | 800 | 37 | 18 |
| 2 |  | 30 | 28 |
| 3 |  | 28 | 33 |
| 4 |  | 27 | 36 |
| 5 |  | 27 | 41 |
| 6 |  | 27 | 45 |
| 7 | 600 | 40 | 14 |
| 8 |  | 30 | 24 |
| 9 |  | 27 | 32 |
| 10 |  | 24 | 39 |
| 11 |  | 23 | 42 |
| 12 |  | 23 | 48 |
| 13 |  | 23 | 52 |
| 14 | 400 | 42 | 11 |
| 15 |  | 31 | 19 |
| 16 |  | 28 | 24 |
| 17 |  | 24 | 36 |
| 18 |  | 20 | 44 |
| 19 |  | 19 | 48 |
| 20 |  | 19 | 54 |
| 21 |  | 19 | 60 |

As is understood from FIG. 1, when highly concentrated fluonitric acid where the total a+b of the hydrofluoric acid concentration and the nitric acid concentration is 50 wt % or more is used, it is possible to rapidly perform wet etching at a rate of 400 μm/min or more. More specifically, it has been experimentally found that it is possible to obtain an etching rate of 400 μm/min or more by selecting a composition in a range approximately represented by a+b 50, $19 \leq a \leq 42$. Furthermore, it has been found that it is possible to obtain an etching rate of 600 μm/min or more by $20 \leq a \leq 40$ and an etching rate of 800 μm/min or more by $27 \leq a \leq 37$.

Figure 2:
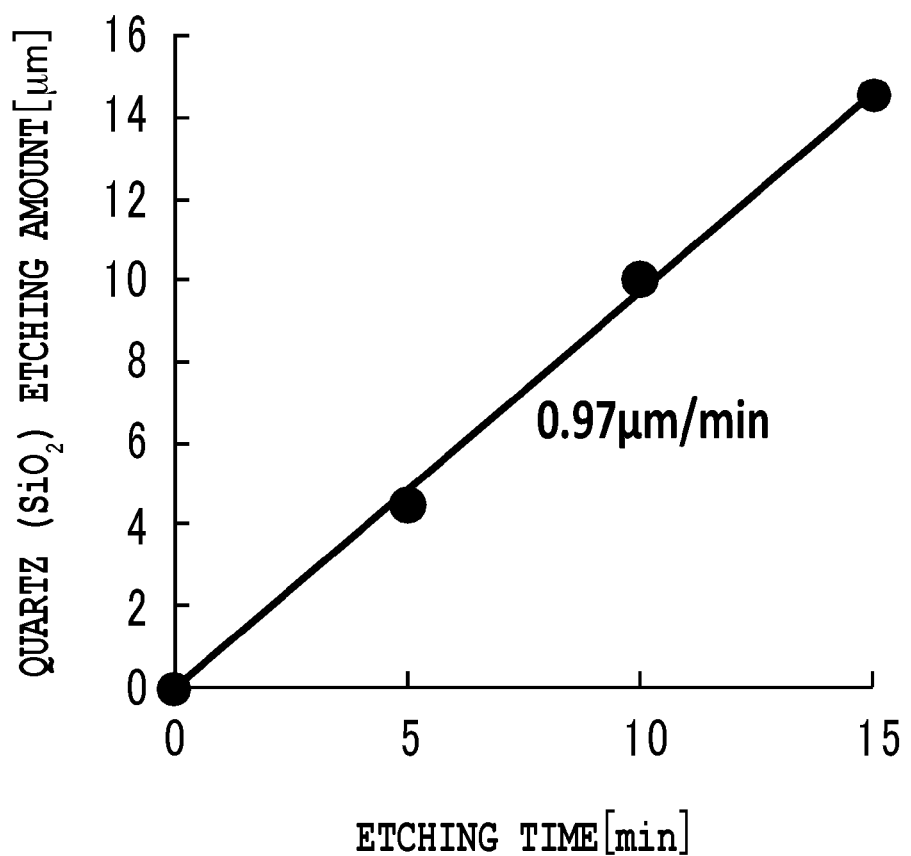
FIG. 2 is a diagram showing the results of an experiment of etching an $SiO_2$ layer with highly concentrated fluonitric acid.

FIG. 2 shows the results of an experiment (this experiment is hereinafter also referred to as "experiment 2") of etching the $SiO_2$ layer with the highly concentrated fluonitric acid. As the $SiO_2$ layer, a fused quartz substrate was used. The shape of a sample was made substantially the same as that of the silicon chip. An etching solution (chemical solution) having a composition of HF (30 wt %) $HNO_3$ (28 wt %) $H_2O$ (42 wt %) was used. This etching solution is the same as sample solution No. 2 in table 1, and has a capacity of a silicon etching rate of 800 μm/min. The sample chip was exposed to the chemical solution, and the etching was performed. The time period was set at 5, 10 and 15 minutes. The sample chip was shaken within the etching solution at a speed of 1.5 second/round trip in a range of 3 cm to 5 cm in the direction of the flat surface of the chip sample. The etching rate was assumed to be the amount of etching on one side per minute. The thickness before and after the etching was measured with a micrometer.

As is understood from FIG. 2, the etching rate of the $SiO_2$ layer with the highly concentrated fluonitric acid of the composition described above is 0.97 μm/min, and, since the etching rate is 1/800 or less of the etching rate of the Si substrate, it can be said that the $SiO_2$ layer is hardly etched.

As described above, the appropriate selection of the composition allows the selective etching of the Si substrate with the highly concentrated fluonitric acid. Here, the reaction of fluonitric acid with Si and $SiO_2$ will be described.

Fluonitric acid is a liquid mixture of hydrofluoric acid (HF) and nitric acid ($HNO_3$). Nitric acid oxygenates silicon (Si), and hydrofluoric acid reacts with oxide silicon ($SiO_2$) to dissolve. More specifically, a minute part of a hydrogen fluoride molecule is dissociated in the liquid mixture such that $HF \rightarrow H^+ + F^-$, and the generated $F^-$ ion is bound with a neutral HF molecule to generate an $HF_2^-$ ion (hydrogen difluoride ion). $SiO_2$ having a stoichiometric composition ratio is etched by the $HF_2^-$ ion but is not etched by the neutral HF molecule; however, since oxide silicon ($SiO_{2-x}$) formed by the reaction of $HNO_3$ and Si is oxygen-deficient, it is also etched by the neutral HF molecule. The high-speed etching of Si with the highly concentrated fluonitric acid can be understood in this way. Its reaction formula is expressed as follows.

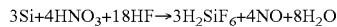

$$3Si + 4HNO_3 + 18HF \rightarrow 3H_2SiF_6 + 4NO + 8H_2O$$

For the etching of 1 silicon atom, 1.33 molecules of $HNO_3$ and 6 molecules of HF are used, and, as reaction products, 1 molecule of $H_2SiF_6$, 1.33 molecules of NO and 2.66 molecules of $H_2O$ are generated.

Although the $SiO_2$ layer is reached by the etching of the Si substrate of the SOI substrate, since the $SiO_2$ layer has a stoichiometric composition ratio, it is etched only by the $HF_2^-$ ion. Since hydrofluoric acid is partially dissociated, the concentration of the $HF_2^-$ ion is about 1/1000 of the concentration of the neutral HF molecule, and only a very small number of $HF_2^-$ ions are present in hydrofluoric acid in a dissociation equilibrium state. Hence, the progress of the etching of the $SiO_2$ layer having a stoichiometric composition ratio by the $HF_2^-$ ion is negligibly slow as compared with the progress of the etching of the Si substrate with fluonitric acid. In other words, the etching rate ratio of the $SiO_2$ layer to the Si substrate of the SOI substrate is significantly low.

(Backside Illumination Type Photoelectric Conversion Module According to the Present Invention)

A backside illumination type photoelectric conversion module according to the present invention will be described. A first SOI substrate was prepared in which a photoelectric conversion portion having an effective pixel number of 4.5 million pixels where pixel (light receiving surface) size 1.8 μm square CMOS photoelectric conversion elements are two-dimensionally arranged on a Si semiconductor layer (surface Si layer) 5 μm thick provided on an $SiO_2$ layer was formed. When the backside Si layer (Si substrate) of the first SOI substrate was etched with a high-speed etching solution of the present invention for one minute, the etching was completely stopped on the $SiO_2$ layer, and the $SiO_2$ layer surface was exposed. The smoothness of the exposed $SiO_2$ layer surface was significantly satisfactory. When the SOI substrate was etched, the surface side where the photoelectric conversion elements were formed was adhered to the substrate of an etching device, and the etching was performed while the etching solution for ultra-high speed etching was supplied from a nozzle to the surface.

Then, the first substrate on which the etching processing has been performed is adhered by micro-bump technology to a previously prepared second substrate in which, on the surface region of a Si semiconductor substrate, a drive circuit for driving the photoelectric conversion elements of the photoelectric conversion portion was provided. At the time of the adhering, the free surface of the Si semiconductor layer (surface Si layer) of the etched first substrate was adhered to the free surface of the surface region on which the drive circuit was provided such that they were opposite each other. In this way, a pre-photoelectric conversion module was formed.

Then, on the $SiO_2$ layer surface of the pre-photoelectric conversion module, micro-lenses were provided in a general manner so as to correspond to the individual pixels. The pre-photoelectric conversion module provided with the micro-lenses was held in a predetermined ceramic package, and it was used as the photoelectric conversion module. This photoelectric conversion module was mounted in a commercially available video camera that had been adapted for the experiment, and moving images were shot for 5 minutes. When the moving images shot were seen on an HDTV monitor, the images were significantly sharp and bright as compared with images that were shot with a video camera incorporating a conventional surface illumination type photoelectric conversion module of the same system. It has been clarified that the images were comparable in sharpness to the conventional type, and were excellent in optical sensitivity.

At the present time, when the thickness of a Si wafer is reduced, since the wafer was ground by mechanical polishing using abrasive grains, the region on the opposite side where photoelectric conversion elements are formed is significantly damaged, and this results in a high dark current. In the present invention, since the entire polishing is performed by wet etching, it is possible to reduce the thickness of the wafer for a short period of time without any damage at all.

The composition of the ultra-high speed etching solution used in the present example is as follows:

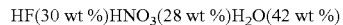

HF(30 wt %)$HNO_3$(28 wt %)$H_2O$(42 wt %)

This etching solution has an etching rate of 800 μm/min for Si; the etching solution having an etching rate of 800 μm/min for Si is present in a wide range as is understood from FIG. 1.

Although in the present example, as the second substrate, a bulk type Si substrate was used, the SOI substrate may also be used. Although in the present example, in the pre-photoelectric conversion module, the drive circuit was provided on the second substrate separate from the SOI substrate, the optical conversion portion and the drive circuit may be integrated into the surface Si layer of the SOI substrate.

(Device for Implementing an Etching Method According to the Present Invention)

Figure 3:
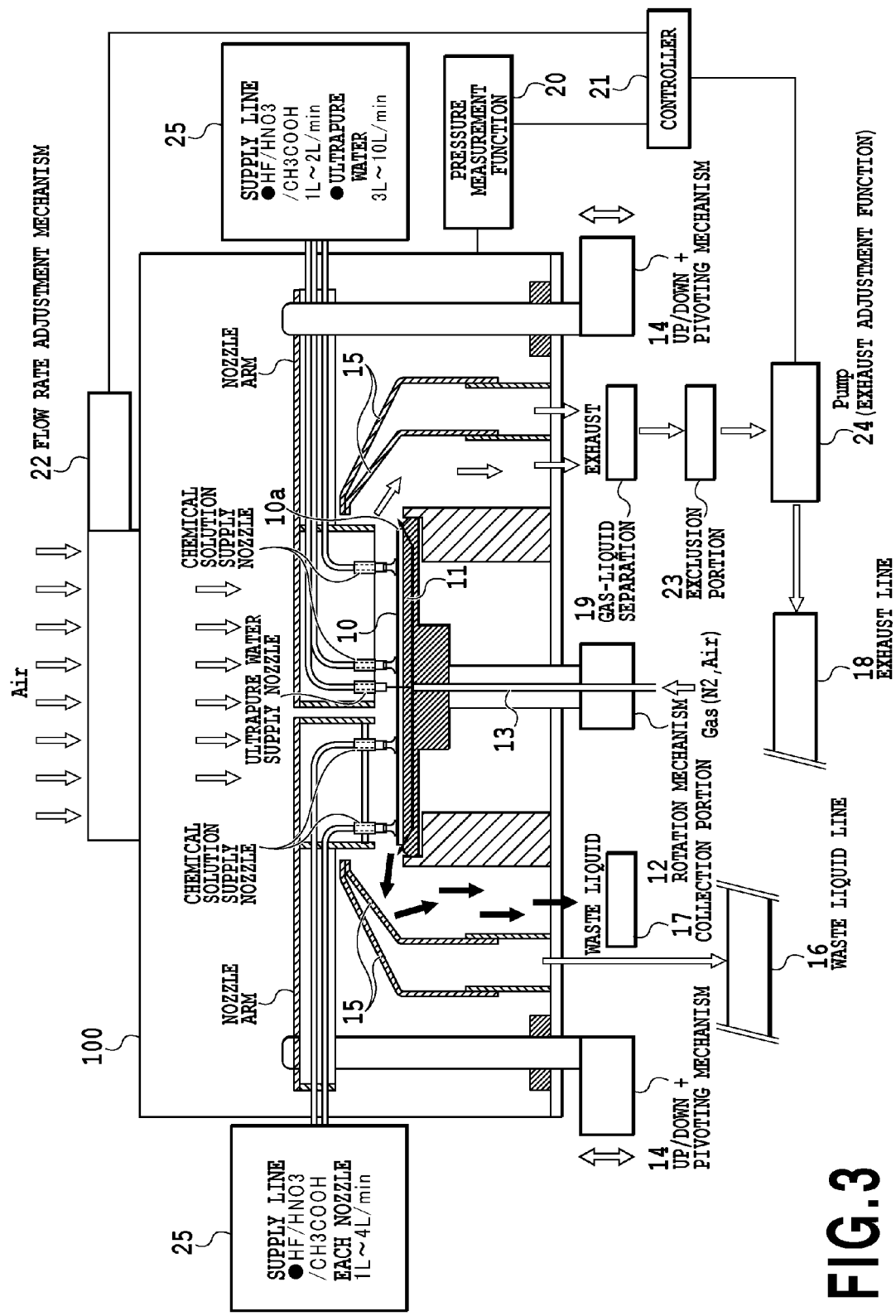
FIG. 3 is a schematic overall diagram (cross-sectional view taken along line III-III" of FIG. 6A) of an etching processing chamber 100.

FIG. 3 shows a schematic overall diagram (cross-sectional view taken along line III-III" of FIG. 6A) of an etching processing chamber 100. A stage 11 that retains a silicon substrate 10, a rotation mechanism 12 that rotates the stage 11, and a line 13 that supplies gas for preventing the movement of a chemical solution to a frontside 10a opposite to a backside on which the silicon substrate 10 is processed are provided. Four arms that supply the chemical solution to the backside which is a processing surface of the silicon substrate 10 and a plurality of chemical solution supply nozzles are provided. The arms have an up/down mechanism•pivoting mechanism 14 for the supply of the chemical solution to an appropriate position on the processing surface of the silicon substrate 10 from the nozzles. In a supply line 25, a valve for the supply and stop of the chemical solution and ultrapure water is provided, and the valve has a Water Hummer prevention mechanism that prevents Water Hummer when the chemical solution and the ultrapure water are supplied to the valve. In order to rapidly and accurately open and close the valve, an electric-operated valve incorporating an electrical double layer capacitor is needed. Water Hummer is caused by reduction of a volume within the valve when an incompressible fluid is used, especially when the valve is closed; specifically, as the Water Hummer prevention mechanism described above, a valve in which its volume therewithin is not changed when the valve is opened and closed is used. A cup 15 for discharging the chemical solution supplied to the processing surface of the silicon substrate 10 and used in the etching of the silicon substrate, a waste liquid line 16, a collection portion 17 and an exhaust line 18 for exhausting a gas generated by the etching processing are made to communicate with each other. The waste liquid and the exhaust are separated and exhausted with a gas-liquid separation function 19. A pressure measurement function 20 that measures a pressure within the etching processing chamber 100, a controller 21 that controls the pressure and a flow rate adjustment mechanism 22 that supplies a gas (clean air) for exhausting a reaction generation gas and the like from the chamber 100 and that adjusts the amount of the gas supplied are provided; in the exhaust line, an exclusion portion 23 that excludes the gas generated in the etching processing and an exhaust adjustment function 24 (ex. a pump) for rapidly discharging the gas from the etching processing chamber 100 are provided.

Figure 4:
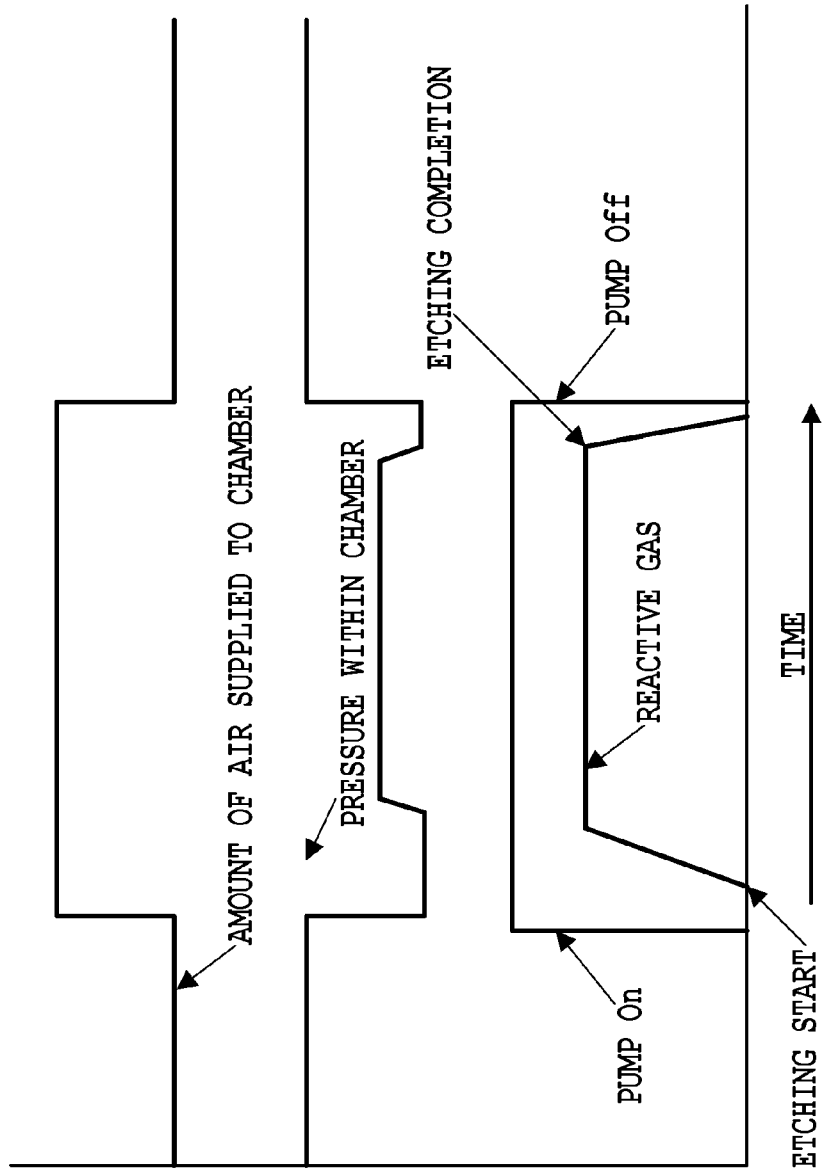
FIG. 4 is an explanatory diagram illustrating an example of the pressure control of the etching processing chamber 100.

FIG. 4 shows an example of the pressure control of the etching processing chamber 100. In the present invention, a large amount of NO gas is generated by the etching. It is necessary to rapidly discharge this gas to the outside of the chamber. Hence, the pump is provided in the exhaust line of the chamber. Before the start of the etching, the pump is operated, the amount of air supplied into the chamber is changed from an amount at the time of standby to an amount at the time of the etching and then the etching is started. After the completion of the etching, the operation of the pump is stopped, and the amount of air supplied into the chamber is returned to the amount at the time of standby.

Figure 5A:
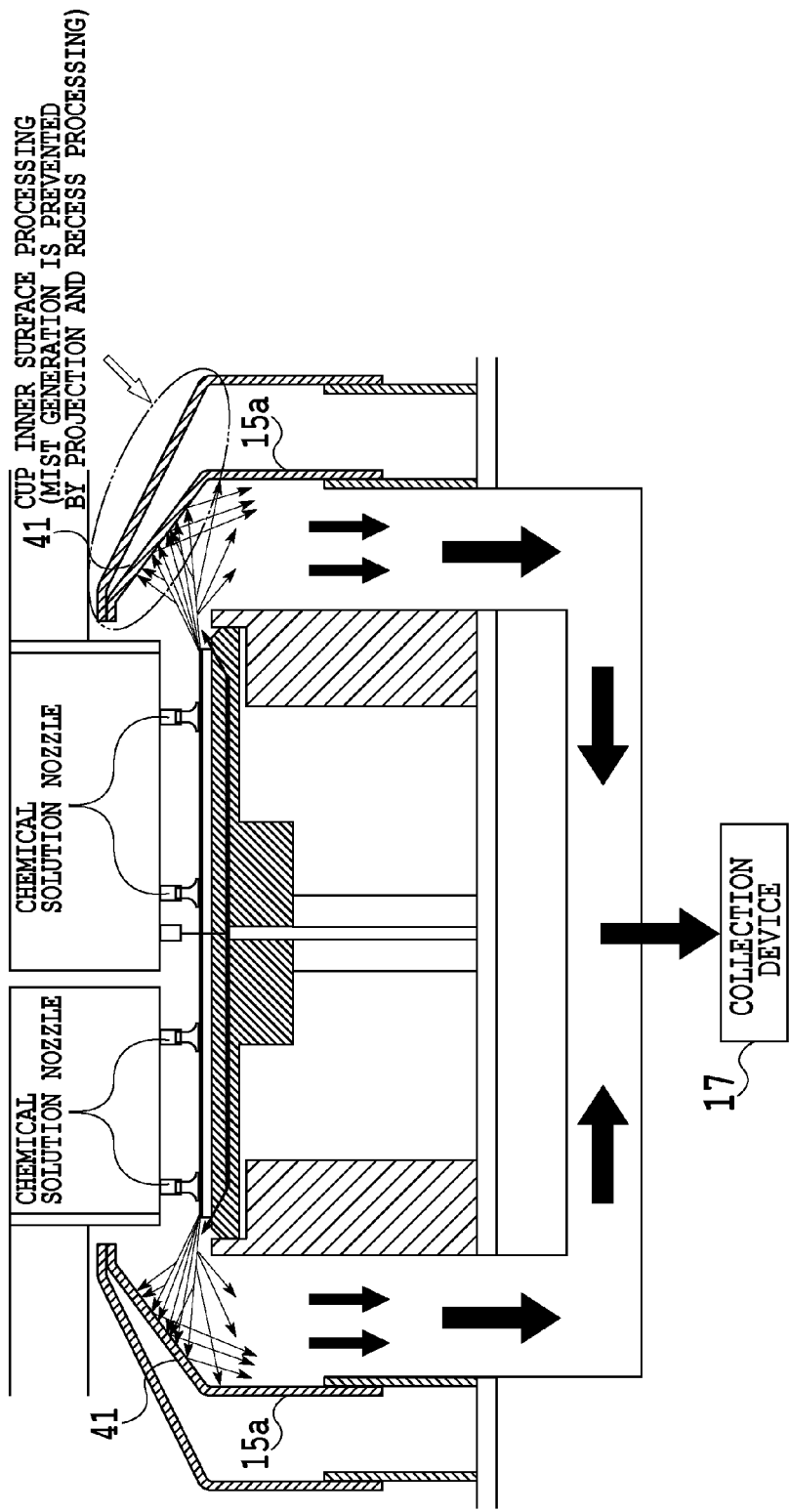
FIG. 5A is a schematic cross-sectional view for illustrating ultra-high speed etching processing in a cross section taken along VA-VA" line of FIG. 6A.
Figure 5B:
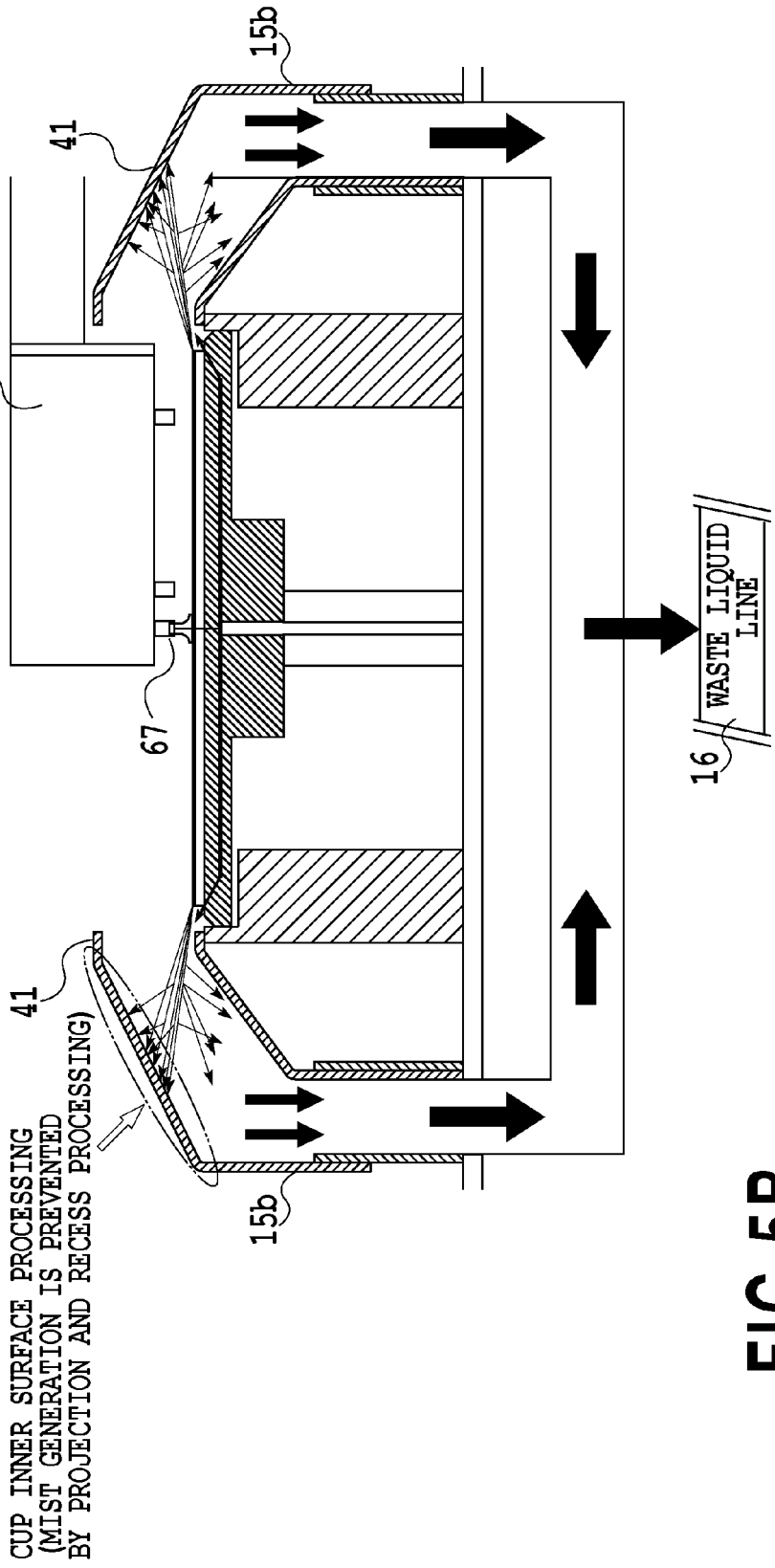
FIG. 5B is a schematic cross-sectional view for illustrating ultrapure water washing liquid supply and waste liquid processing in a cross section taken along VB-VB" line of FIG. 6A.
Figure 6A:
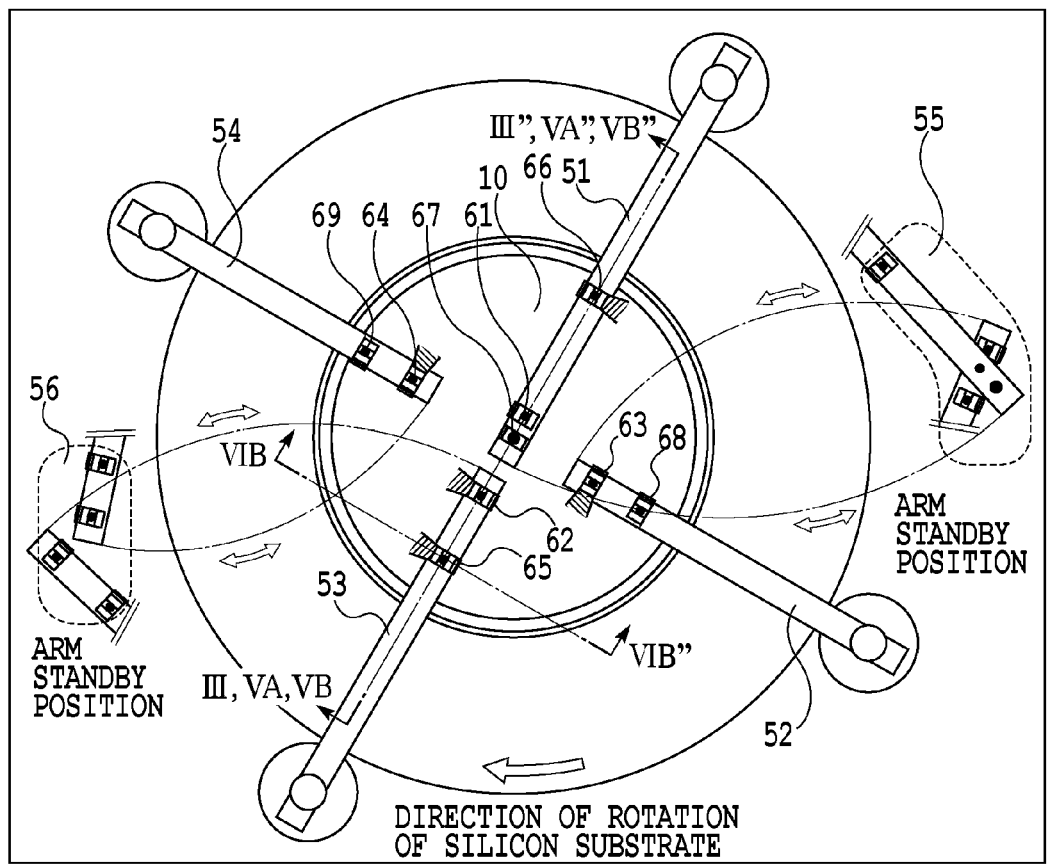
FIG. 6A is a schematic diagram for illustrating an example of the chemical solution supply arms and the nozzles of the etching processing chamber 100.

FIGS. 5A and 5B are schematic cross-sectional views for respectively illustrating the ultra-high speed etching processing and the ultrapure water washing liquid supply and the waste liquid processing in cross sections taken along VA-VA" line and VB-VB" line of FIG. 6A. The cup 15 for guiding the waste liquid and the exhaust provided in the etching processing chamber 100 has a two-stage structure; an inside cup 15a is used in the ultra-high speed etching processing and an outside cup 15b is used in the ultrapure water washing processing. In the switching of the cups 15a and 15b, only a cup necessary for the up/down operation of the cup is open, and both cups are closed during standby. The chemical solution used in the ultra-high speed etching processing is supplied through the cup 15a to the collection device 17, and thus it is possible to reuse the etching chemical solution. The liquid used in the ultrapure water washing processing is passed to the waste liquid line 16. A tapered surface 41 with which the chemical solution in the cups 15a and 15b makes contact undergoes projection and recess processing, and this prevents the following: the chemical solution is rebounded as liquid droplets and a mist, and they are scattered over the surface of the silicon substrate 10 and the etching processing chamber 100.

Figure 6B:
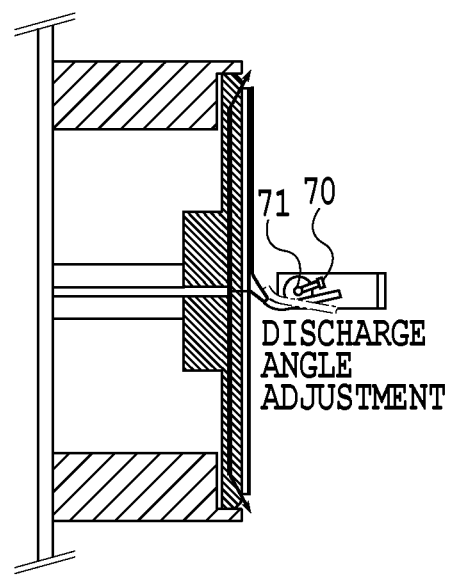
FIG. 6B is a cross-sectional view taken along line VIB-VIB" line of FIG. 6A.

FIG. 6A is a schematic diagram for illustrating an example of the chemical solution supply arms and the nozzles of the etching processing chamber 100; FIG. 6B is a cross-sectional view taken along line VIB-VIB" line of FIG. 6A. A plurality of chemical solution supply nozzles for discharging the chemical solution to the wafer is provided. The nozzles are arranged in the arms. A plurality of nozzles is provided, and thus it is possible to supply the amount and the composition of the chemical solution to be supplied to a plurality of places on the wafer surface appropriately for each of the places in a different manner. As the arms, four arms are provided at an angle of about 90° with respect to each other. The arms have a pivoting function with a rotational axis center and an up/down operation function; processing is performed by moving the arms where the chemical solution to be supplied is placed to a chemical solution supply position. After the completion of the processing, the arms are rapidly moved from the top of the silicon substrate 10 to standby positions. The arm 51 and the arm 52 are placed on standby in the standby position 55; the arm 53 and the arm 54 are placed on standby in the standby position 56. Each of the nozzles has the function of adjusting a liquid supply angle to the silicon substrate 10. A fixing bolt 70 is undone, and the angle of the nozzle is adjusted with a round bar-shaped nozzle shaft in the center. Thus, it is possible to adjust the flow of the chemical solution after the chemical solution has been supplied to the silicon substrate 10 and prevent the chemical solution from being scattered. The first nozzle 61 that supplies the etching solution to the vicinity of the center (about 20 mm from the center) supplies the etching solution substantially perpendicularly to the silicon substrate processing surface. The amount of solution is about 1 liter/min; the inside diameter of the nozzle supplying the etching solution is about 4.2 mm (corresponding to one-fourth inch). The second nozzle 62 is arranged in the arm 53 on the opposite side (an angle difference of about 180°) to the arm 51 arranged in the first nozzle 61. The distance from the center is about 50 mm; the flow rate of etching solution supplied is about 1 liter/min. The second nozzle 62 is tilted about an angle of 30° in the direction of rotation of the silicon substrate 10. The third nozzle 63 is arranged in the arm 52 between the nozzle 61 and the nozzle 62 (at an angle of 90°), the distance from the center is about 75 mm and the angle is about 45°. The flow rate of etching solution supplied is about 1.2 liters/min. Furthermore, the fourth nozzle 64 is arranged in the arm 54 on the opposite side to the third nozzle 63. The position from the center is about 95 mm; the amount of solution supplied is about 2 liters/min. The angle is about 45°. The fifth nozzle 65 is arranged in the arm 53 where the second nozzle is arranged, the distance from the center is about 115 mm, the angle is about 60° and the flow rate of etching solution supplied is about 3 liters/min. The sixth nozzle 66 is attached to the arm 51 where the first nozzle 61 is arranged, the distance from the center is about 135 mm, the angle is 60° and the flow rate of etching solution supplied is about 4 liters/min. The nozzle 67 that supplies the ultrapure water after the stop of the etching is installed substantially in the center of the arm 51 where the first nozzle 61 is arranged. The flow rate of ultrapure water supplied is 3 liters/min to 10 liters/min. Among the nozzles that supply the etching solution, the nozzle arranged in the outer circumferential portion supplies a larger amount of etching solution. In order for the flow rate of solution discharged to be substantially equal, a nozzle discharge portion in the outer circumferential portion has a larger nozzle inside diameter.

FIG. 7 shows a relationship between nozzle positions (distances from the center) and the rotational direction. When two different nozzles close to the center of the silicon substrate supply the solution, if the nozzles supply it in positions where an angle difference is low, their flows of the solution may interfere with each other. In order for this problem to be solved, for example, as indicated by (1), (2) and (5) and (6) in the figure, the nozzles close to the center of the silicon substrate supply the solution in a positional relationship of an angle difference of 180° such that their flows of the solution interfere the least with each other. In (3) and (4) located in the vicinity of the intermediate point between (1) and (2) and (5) and (6), an angle difference of 90° with respect to (1) and (2) is provided, and the nozzles at (3) and (4) supply the solution in a positional relationship of an angle difference of 180°.

TABLE 2

| Number | Nozzle position (mm) | Nozzle outside diameter (inch) | Amount of solution (l/min) |
|---|---|---|---|
| 1 | 20 | ¼ | 1 |
| 2 | 40 | ¼ | 1 |
| 3 | 75 | ⅜ | 1.2 |
| 4 | 95 | ⅜ | 2 |
| 5 | 115 | ⅜ | 3 |
| 6 | 135 | ⅜ | 4 |

Figure 8:
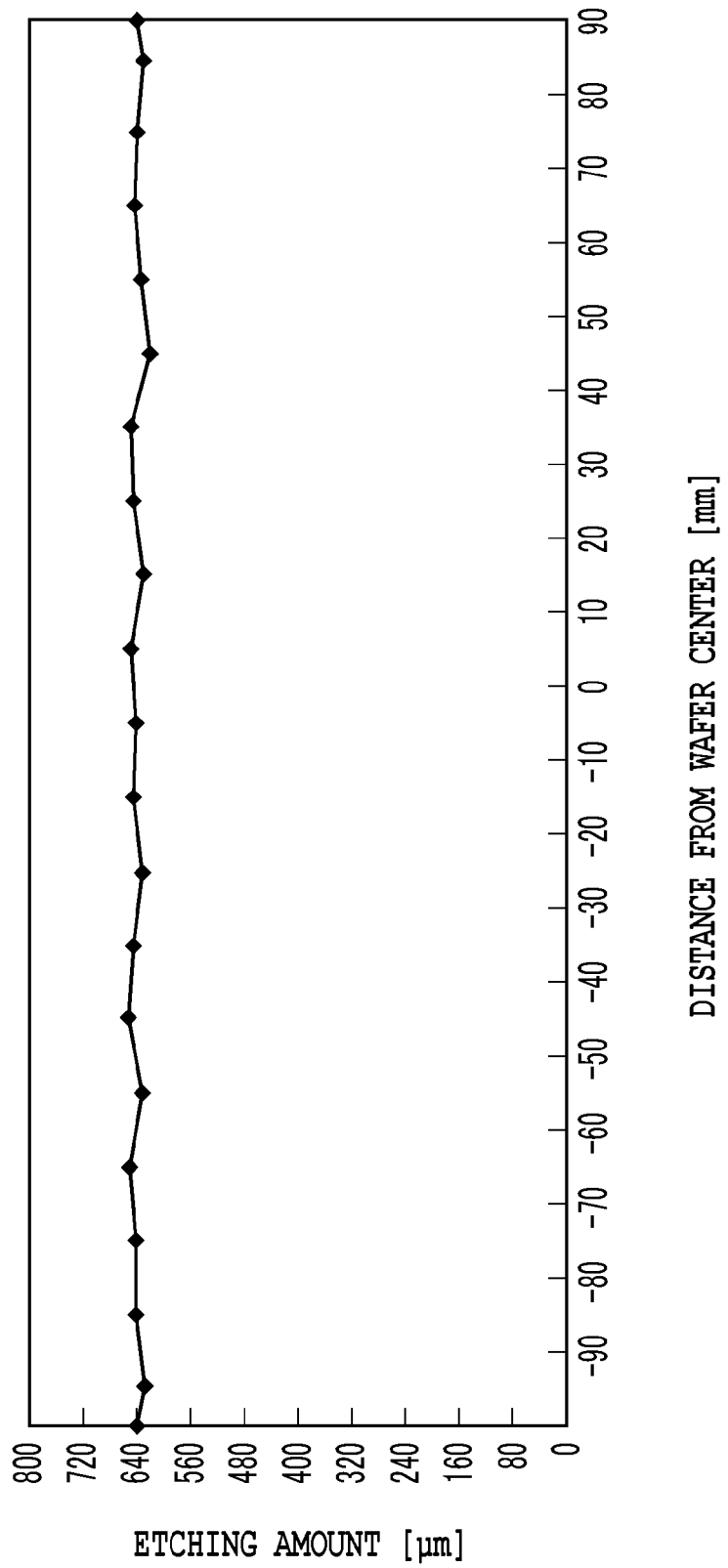
FIG. 8 is a graph showing the results of the etching of a silicon substrate having a thickness of 725 μm and a diameter of 200 mm.

FIG. 8 shows the results of the etching of a silicon substrate having a thickness of 725 (m and a diameter of 200 mm (this experiment is hereinafter referred to as "experiment 3"). A P-type silicon wafer having a diameter of 200 mm and a thickness of 725 (m was prepared, and the following experiment was conducted on the measurement of smoothness.

In order to uniformly etch the entire wafer for a short period of time, spin etching performed by an individual-processing washing device (a device obtained by improving an individual-processing device made by Realize AT Corporation) shown in FIGS. 3 to 7 was used. This device has four chemical solution supply nozzles and one ultrapure water nozzle for stopping the etching. The ultrapure water supply nozzle was arranged in the center of the wafer, and the four chemical solution supply nozzles were provided such that they were able to be arranged from the center to the periphery. In order to prevent interference between the chemical solutions, the nozzles were provided such that they were able to be arranged to be displaced 90 (with respect to each other. Furthermore, in order to prevent scattering of the solution, the nozzles were provided such that they were able to be tilted in the direction of rotation of the wafer.

In the experiment, as the mixed acid chemical solution, $HNO_3$ (28 wt %)/HF (30 wt %)/$H_2O$ (42 wt %) was used. The nozzles were positioned as follows:

The position of the first nozzle: 20.5 mm from the center

The position of the second nozzle: 52.5 mm from the center (arranged in a position opposite to the first nozzle through the center of the wafer)

The position of the third nozzle: 72 mm from the center (arranged between the first and second nozzles, that is, in a position displaced 90° from them)

The position of the fourth nozzle: 85 mm from the center (arranged in a position opposite to the third nozzle through the center of the wafer)

The amount of chemical solution discharged from each of the chemical solution nozzles was as follows:

The first nozzle: 1 liter/min

The second nozzle: 1 liter/min

The third nozzle: 1.2 liters/min

The fourth nozzle: 2 liters/min

The number of revolutions was set at 850 rpm, and the etching was performed for 40 seconds, and then the supply of the chemical solution from each of the nozzles was stopped, and simultaneously, the ultrapure water was supplied from the nozzle in the center portion at a rate of 3 liters/min and the etching was stopped. In the amount of etching, the wafer laser thickness measuring device (PLT-1315 made by Possible Inc.) described with reference to FIG. 1 and used in experiment 1 was used. The result is shown in FIG. 8. As shown in the figure, it is found that the etching was substantially uniformly performed in the width of a diameter of 180 mm.

Moreover, 300 points were uniformly and randomly selected from the entire etching surface of the wafer, and the amounts of etching were measured at those points, with the result that the measurements fall within ±5 μm. It has been confirmed that the smoothness of the wafer etching surface was excellent.

Furthermore, the following experiment was conducted on the smoothness (this experiment is hereinafter also referred to as "experiment 4"). Except the following conditions and procedure, the experiment was conducted in the same manner as in experiment 3 described above with reference to FIG. 8.

The nozzles were positioned as follows:

The position of the first nozzle: 20 mm from the center

The position of the second nozzle: 50 mm from the center (arranged in a position opposite to the first nozzle through the center of the wafer)

The position of the third nozzle: 52 mm from the center (arranged in the arm between the first and second nozzles)

The position of the fourth nozzle: 85 mm from the center (arranged in a position opposite to the third nozzle through the center of the wafer)

The amount of chemical solution discharged from each of the chemical solution supply nozzles was as follows:

The first nozzle: 1 liter/min

The second nozzle: 1 liter/min

The third nozzle: 1.4 liters/min

The fourth nozzle: 1.0 liter/min

The number of revolutions was set at 850 rpm, and the etching was performed for 15 seconds, and then the supply of the chemical solution from each of the nozzles was stopped, and simultaneously, the ultrapure water was supplied from the nozzle in the center portion at a rate of 3 liters/min, the etching was stopped and spin drying was performed. Next, under the same conditions as the first step, the etching and the spin drying were performed. Thereafter, except that the etching was performed for 8 seconds, the same step as the previous step was performed.

As in experiment 3, in the amount of etching, the wafer laser thickness measuring device (PLT-1315 made by Possible Inc.) used in experiment 1 was used. The satisfactory results as compared with the experiment 3 were obtained.

The invention claimed is:

1. A method of producing a backside illumination type photoelectric conversion module, the method comprising the steps of:

producing a pre-photoelectric conversion module having a photoelectric conversion portion with a plurality of photoelectric conversion elements on the surface Si layer of an SOI substrate comprising an $SiO_2$ layer between a Si substrate and a surface Si layer; and etching a free surface of the Si substrate with an etching method comprising a step of exposing a free surface of the Si substrate to a fluonitric acid HF(a) $HNO_3$(b) $H_2O$ (c) (where a, b and c are numerical values representing concentrations, the unit thereof is wt % and a+b+c=100), so that at least a part of the $SiO_2$ layer is exposed and the etching is stopped on the $SiO_2$ layer, wherein a composition of the fluonitric acid satisfies a+b≥50 and an opening portion that exposes the $SiO_2$ layer is an entrance surface through which light enters the photoelectric conversion portion.

2. The etching method according to claim 1, wherein the $SiO_2$ layer has a stoichiometric composition ratio.

3. The etching method according to claim 1 or 2, wherein the composition of the fluonitric acid satisfies $19 \leq a \leq 42$.

4. The etching method according to claim 3, wherein the composition of the fluonitric acid further satisfies $23 \leq a \leq 40$.

5. The etching method according to claim 4, wherein the composition of the fluonitric acid further satisfies $27 \leq a \leq 37$.

\* \* \* \* \*